(12) United States Patent
Ishikawa

(10) Patent No.: US 7,535,155 B2
(45) Date of Patent: May 19, 2009

(54) PIEZOELECTRIC DEVICE AND PIEZOELECTRIC SWITCH PROVIDED WITH THE SAME

(75) Inventor: Katsuyuki Ishikawa, Kedah Darul Aman (MY)

(73) Assignee: Taiheiyo Cement Corporation, Tokyo (JP)

( * ) Notice: Subject to any disclaimer, the term of this patent is extended or adjusted under 35 U.S.C. 154(b) by 86 days.

(21) Appl. No.: 11/660,666

(22) PCT Filed: Jul. 11, 2005

(86) PCT No.: PCT/JP2005/012783

§ 371 (c)(1), (2), (4) Date: Feb. 21, 2007

(87) PCT Pub. No.: WO2006/022084

PCT Pub. Date: Mar. 2, 2006

(65) Prior Publication Data

US 2007/0252479 A1 Nov. 1, 2007

(30) Foreign Application Priority Data

Aug. 24, 2004 (JP) .............................. 2004-243919

(51) Int. Cl.
*H01L 41/08* (2006.01)
(52) U.S. Cl. ....................................... 310/339; 310/364
(58) Field of Classification Search ......... 310/330–332, 310/339, 359, 364
See application file for complete search history.

(56) References Cited

U.S. PATENT DOCUMENTS

| | | | | |
|---|---|---|---|---|
| 3,500,451 A | * | 3/1970 | Yando | 310/330 |
| 4,387,318 A | * | 6/1983 | Kolm et al. | 310/330 |
| 4,769,882 A | * | 9/1988 | Rosen et al. | 29/25.35 |
| 5,751,091 A | | 5/1998 | Takahashi et al. | |
| 5,814,921 A | * | 9/1998 | Carroll | 310/339 |
| 6,252,336 B1 | * | 6/2001 | Hall | 310/339 |
| 6,323,583 B1 | * | 11/2001 | Gunther et al. | 310/330 |
| 6,541,898 B2 | * | 4/2003 | Kitajima et al. | 310/363 |

(Continued)

FOREIGN PATENT DOCUMENTS

JP    59-32182 A  *  2/1984   .................. 310/332

(Continued)

OTHER PUBLICATIONS

Office Action issued in corresponding Japanese Patent Application 2004-243919 (2 pages), English Translation (2 pages).

*Primary Examiner*—Thomas M Dougherty
(74) *Attorney, Agent, or Firm*—Birch, Stewart, Kolasch & Birch, LLP

(57) ABSTRACT

There are provided a piezoelectric device, in which piezoelectric element surfaces are prevented from cracking and warping by reducing tensile stress generated within the piezoelectric element by an external force, and a piezoelectric switch utilizing the same.

The piezoelectric device comprises a piezoelectric element having a plate-like shape including a piezoelectric body having a plate-like shape and polarized in a thickness direction thereof and a pair of electrodes formed on both main surfaces of the piezoelectric body, and a pair of elastic conductive members fixed to the both main surfaces of the piezoelectric element, wherein when an external force is applied, the piezoelectric body is deformed to generate electricity.

20 Claims, 11 Drawing Sheets

U.S. PATENT DOCUMENTS

| | | | |
|---|---|---|---|
| 7,061,164 B2 * | 6/2006 | Iwasaki et al. | 310/364 |
| 2004/0041498 A1 * | 3/2004 | Sakai | 310/339 |
| 2005/0140249 A1 * | 6/2005 | Kita et al. | 310/359 |
| 2005/0280561 A1 * | 12/2005 | Face et al. | 341/34 |
| 2007/0145861 A1 * | 6/2007 | Tanner | 310/339 |

FOREIGN PATENT DOCUMENTS

| | | |
|---|---|---|
| JP | 63-10912 B2 | 3/1988 |
| JP | 7-46388 A | 2/1995 |
| JP | 9-205781 A | 8/1997 |
| JP | 9-211151 A | 8/1997 |
| JP | 2003-7491 A | 1/2003 |
| JP | 2003-218418 A | 7/2003 |
| JP | 2004-146640 A | 5/2004 |

* cited by examiner

PIEZOELECTRIC DEVICE AND PIEZOELECTRIC SWITCH PROVIDED WITH THE SAME

BACKGROUND OF THE INVENTION

1. Field of the Invention

The present invention relates to a piezoelectric device including a piezoelectric element to which an elastic conductive member is fixed, and to a piezoelectric switch provided with the same.

2. Description of the Related Art

Conventionally, there have been an electric generator, which excites a piezoelectric element and allows it to vibrate freely to generate electricity (for example, refer to patent document 1), and a switching circuit, which includes such an electric generator (for example, refer to patent document 2). The above electric generator causes a piezoelectric body to expand and contract by bending a metal plate to which a polarized piezoelectric body in a thin plate-like shape is joined, and generates a voltage using a piezoelectric lateral effect. Therefore, either surface of the plate-shaped piezoelectric element has to be restricted by the metal plate. As specific structures, the following electric generators are now in practical use; i.e., a unimorph type, in which a plate-shaped piezoelectric element provided with electrodes at both sides is fixed to one surface of a metal plate; and a bimorph type, in which a similar piezoelectric element is fixed to both surfaces of a metal plate. A piezoelectric element and a metal plate are generally joined using a thermosetting resin in a heated state. Therefore, the metal plate often employs a material having the same level of low coefficient of thermal expansion as that of the piezoelectric element.

On the other hand, a piezoelectric actuator has been known, which has the same structure as that of the above electric generator and utilizes an inverse piezoelectric effect. In such piezoelectric actuators, some actuators have a structure in which a piezoelectric body is formed on a substrate having a thermal expansion coefficient greater than that of the piezoelectric body to reduce tensile stress within the piezoelectric body (for example, refer to patent document 3). By employing such a structure, the piezoelectric actuator preserves mechanical strength of thin film of the piezoelectric body to prevent the film from being cracked or broken due to the tensile stress.

[Patent document 1] Japanese Patent Application Laid-Open No. 2003-7491

[Patent document 2] Japanese Patent Application Laid-Open No. H7-49388

[Patent document 3] Japanese Patent Application Laid-Open No. 2004-146640

SUMMARY OF THE INVENTION

Problems to be Solved by the Invention

However, in the piezoelectric elements as described above, the surface of the piezoelectric element is easily cracked due to a tensile stress generated within the piezoelectric element in an expansion state thereof. When the piezoelectric element is bent together with the metal plate due to an impact of external force or by an external force, if the piezoelectric element is located at a curvature center side of the bent metal plate, a compression stress is generated within the piezoelectric element; while if the piezoelectric element is located at an opposite side of the curvature center of the bent metal plate, a tensile stress is generated within the piezoelectric element. Particularly, the electric generator is subjected to an uncontrollable external force, and therefore likely to suffer from a stress exceeding its tensile strength. Further, when the surface of the piezoelectric element suffers cracks and the electrode on the surface of the element is divided, the area of the element surface contributing to the generation of electricity is reduced to an extremely small level and fails in generating satisfactory electric power.

On the other hand, in the piezoelectric actuator disclosed in the patent document 3, since the piezoelectric body is formed on a metal plate having a large thermal expansion coefficient, durability against the tensile stress is improved. However, since a piece of plate-shaped piezoelectric body is joined to a piece of metal plate in a heated state, the contraction of the metal plate is larger than that of the piezoelectric body, which easily causes the piezoelectric actuator to warp.

An object of the present invention is to provide a piezoelectric device, which is hardly warped, by reducing the tensile stress generated within the piezoelectric element due to an external force to prevent the surface of the piezoelectric element from being cracked, and to provide a piezoelectric switch utilizing the same.

Means for Solving the Problems

To achieve the above object, a piezoelectric device according to the present invention comprises a piezoelectric element having a plate-like shape including a piezoelectric body having a plate-like shape and polarized in a thickness direction thereof and a pair of electrodes formed on both main surfaces of the piezoelectric body, and a pair of elastic conductive members fixed to the both main surfaces of the piezoelectric element, wherein when an external force is applied, the piezoelectric body is deformed to generate electricity.

As described above, in the piezoelectric device of the present invention, a pair of elastic conductive members is fixed to both main surfaces of the piezoelectric element. Owing to this, the piezoelectric element is prevented from being extremely deformed due to an impact of an external force or by an external force, thus the surface of the piezoelectric element is prevented from being cracked due to a stress. Even when the surface of the piezoelectric element is cracked and the electrode on the surface of the element is divided, area of the element contributing to generation of electricity is preserved and satisfactory electric power can be obtained without degrading its properties. Moreover, two pieces of conductive members sandwich a piece of piezoelectric body having a plate-like shape, thereby preventing the piezoelectric element from being warped.

A piezoelectric device according to the present invention comprises a piezoelectric element having a plate-like shape including a piezoelectric body having a plate-like shape and polarized in a thickness direction thereof and a pair of electrodes formed on both main surfaces of said piezoelectric body, and a pair of elastic conductive members fixed to the both main surfaces of said piezoelectric element, wherein said piezoelectric element is held by said pair of conductive members fixed to both main surfaces thereof being compressed in a direction parallel to the both main surfaces, and when an external force is applied, said piezoelectric body is deformed to generate electricity. With this arrangement, by giving, a compression stress to the piezoelectric element in advance, a tensile stress generated by an external force can be reduced. As a result, the surfaces of the piezoelectric element can be prevented from being cracked due to the tensile stress.

A piezoelectric device according to the present invention comprises a piezoelectric element having a plate-like shape including a piezoelectric body having a plate-like shape and polarized in a thickness direction thereof and a pair of electrodes formed on both main surfaces of said piezoelectric body, and a pair of elastic conductive members fixed to the both main surfaces of said piezoelectric element, wherein the coefficient of thermal expansion of said pair of conductive members is larger than that of said piezoelectric element, and when an external force is applied, said piezoelectric body is deformed to generate electricity. Owing to this, the conductive members, which are cooled after being bonded to the piezoelectric element, contract and hold the piezoelectric element while compressing the same in a direction parallel to the both main surfaces.

A piezoelectric device according to the present invention comprises a piezoelectric element having a plate-like shape including a piezoelectric body having a plate-like shape and polarized in a thickness direction thereof and a pair of electrodes formed on both main surfaces of said piezoelectric body; and a pair of elastic conductive members fixed to the both main surfaces of said piezoelectric element, wherein said piezoelectric element has a rectangular plate-like shape, said pair of conductive members has a rectangular plate-like shape, longer in one longitudinal direction than said piezoelectric element and protrude in one longitudinal direction from said piezoelectric element, a fixing portion for supporting and fixing a pair of end portions of said conductive members, protruding in one longitudinal direction from said piezoelectric element is further comprised, and said fixing portion is provided with an insulator between a pair of end portions of said conductive members, protruding in one longitudinal direction from said piezoelectric element, and when an external force is applied, said piezoelectric body is deformed to generate electricity. By arranging as described above, compared to the case where the piezoelectric element is provided between the fixed ends of the pair of conductive members, the energy loss can be reduced. Moreover, in the fixing portions, the conductive members may be used as extraction electrodes as they are.

A piezoelectric device according to the present invention comprises a piezoelectric element having a plate-like shape including a piezoelectric body having a plate-like shape and polarized in a thickness direction thereof and a pair of electrodes formed on both main surfaces of said piezoelectric body; and a pair of elastic conductive members fixed to the both main surfaces of said piezoelectric element, wherein, said piezoelectric element has a rectangular plate-like shape, in which said piezoelectric body is longer in one longitudinal direction than said pair of electrodes, and a fixing portion for supporting and fixing a pair of end portions of said conductive members, fixed to said piezoelectric body is comprised, said piezoelectric body and said pair of conductive members are longer in a longitudinal direction thereof to the fixing portion side than said pair of electrodes, a portion of the piezoelectric body sandwiched by the pair of electrodes is polarized in a thickness direction thereof, a portion of the piezoelectric body protruding from said pair of the electrodes is not polarized, and when an external force is applied, said piezoelectric body is deformed to generate electricity.

Owing to this arrangement, compared to the case where the piezoelectric element is provided between the fixed ends of the pair of conductive members, the energy loss can be reduced. In a part where electrodes are not provided, the piezoelectric body is not polarized. Moreover, when the conductive members are directly fixed to the piezoelectric body, since the connection therebetween is poor, the loss due to inverse piezoelectric effect does not occur. In the fixing portion, the conductive members can be utilized as extraction electrodes as they are. Only by adjusting the area for the electrode to be printed, the piezoelectric device can be made easily, and thus the labor and cost can be reduced.

A piezoelectric device according to the present invention comprises a central elastic conductive member formed in a plate-like shape, a first piezoelectric element formed in a plate-like shape including a first piezoelectric body, which is formed in a plate-like shape, fixed to one main surface of the central conductive member and polarized in a thickness direction thereof, and a pair of electrodes provided to both main surfaces of the first piezoelectric body, a second piezoelectric element formed in a plate-like shape including a second piezoelectric body, which is formed in a plate-like shape, fixed to the other main surface of the central conductive member and polarized in a thickness direction thereof, and a pair of electrodes provided to both main surfaces of the second piezoelectric body, a first elastic conductive member fixed to a main surface at a side opposite to the central conductive member of the first piezoelectric element, and a second elastic conductive member fixed to a main surface at a side opposite to the central conductive member of the second piezoelectric element, wherein when an external force is applied thereto, the first piezoelectric body and the second piezoelectric body are deformed to generate electricity.

As described above, the piezoelectric device of the present invention is provided with elastic conductive members respectively at the outer side of the first piezoelectric element and the second piezoelectric element. Owing to this arrangement, since the piezoelectric elements are not extremely deformed due to an impact of external force or by an external force, the surfaces of the piezoelectric elements are prevented from being cracked due to the stress. Even when the surface of the piezoelectric elements is cracked and the electrode on the surface of the element is divided, the area of the element contributing to the generation of electricity is preserved, thus satisfactory electric power can be obtained without degrading its properties. Moreover, since the piezoelectric body having a plate-like shape is sandwiched by the conductive members, the piezoelectric elements are prevented from warping. Further, since two pieces of the piezoelectric elements are used, even when the piezoelectric elements are thin, a large voltage can be obtained.

The piezoelectric device is preferred that, an elastic modulus of the pair of conductive members is larger than that of the piezoelectric element. This enables the piezoelectric element to easily follow the movement of the conductive members.

The piezoelectric device is preferred that, the material and shape of a conductive member fixed to one electrode of the piezoelectric element are the same as those of a conductive member fixed to the other electrode.

Owing to this, since the piezoelectric device has a symmetrical structure with respect to the piezoelectric element, the compression stress acts thereon uniformly, thus the warp can be further prevented. Moreover, when the piezoelectric element and the conductive members are in free vibration, quality factor Q becomes larger, thus the conversion efficiency of the energy can be increased.

A piezoelectric switch of the present invention comprises the above piezoelectric devices, an external force transmitting section for transmitting an external force to bend the piezoelectric element and the conductive member of the piezoelectric device, and a signal generating circuit that takes out a voltage generated by the piezoelectric element vibrated by a transmitted external force from a pair of conductive members and converts the voltage into an electric signal.

Owing to this arrangement, the piezoelectric element is not extremely deformed due to an impact of an external force or by an external force. Therefore, the surface of the piezoelectric element is prevented from being cracked causing a breakage of the piezoelectric switch. Even when the surface of the piezoelectric element gets a crack and the electrode is divided, the area of the element contributing to generation of the electricity can be preserved, and thus a satisfactory electric signal can be obtained as the switch. Moreover, by adopting a structure such that a piece of piezoelectric member having a plate-like shape is sandwiched by the two pieces of the conductive members, the piezoelectric element is prevented from warping, and thus the piezoelectric switch, which is easy to manufacture and hardly broken, can be achieved.

Effect of the Invention

The piezoelectric device according to the present invention is not extremely deformed due to an impact of an external force or by an external force. Therefore, the surface of the piezoelectric element is prevented from being cracked. Even when the surface of the piezoelectric element gets a crack and the electrode is divided, the area of the element contributing to the generation of electricity can be preserved, and thus a satisfactory electric power can be obtained. Moreover, by adopting a structure such that a piece of piezoelectric body having a plate-like shape is sandwiched by the two pieces of the conductive members, the piezoelectric element can be prevented from being warped.

According to the piezoelectric switch of the present invention, the piezoelectric element is not extremely deformed due to an impact of an external force or by an external force. Therefore, the surface of the piezoelectric element is prevented from being cracked and the piezoelectric switch is prevented from being broken. Even when the surface of the piezoelectric element gets a crack and the electrode is divided, the area of the element contributing to the generation of electricity can be preserved, and thus a satisfactory electric signal can be obtained as the switch. Moreover, by adopting a structure such that a piece of piezoelectric body having a plate-like shape is sandwiched by the two pieces of the conductive members, the piezoelectric element is prevented from warping, and thus the piezoelectric switch, which is easy to manufacture and hardly broken, can be achieved.

BRIEF DESCRIPTION OF THE DRAWINGS

FIG. 2β is a sectional view of the cooled piezoelectric element and conductive member.

DETAILED DESCRIPTION OF THE INVENTION

Figure 1:
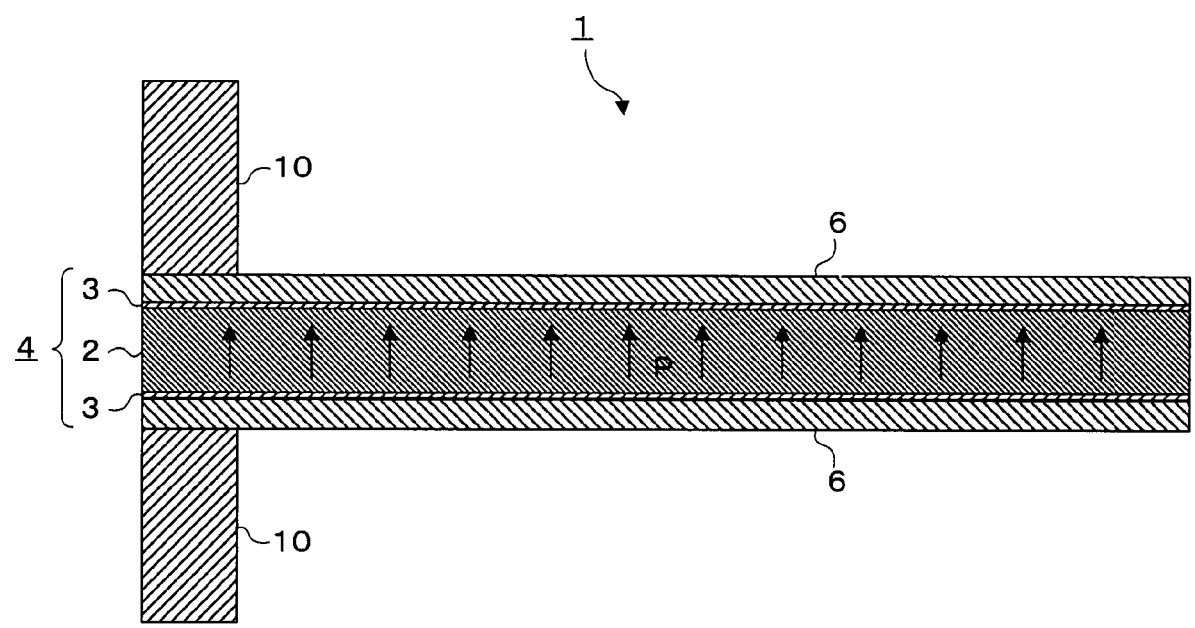
FIG. 1 is a sectional view showing a first embodiment of a piezoelectric device in accordance with the present invention.

Embodiments of the present invention will be hereinafter described with reference to the drawings. For the convenience of understanding the description, the same component elements in the drawings will be given the same reference numerals and redundant descriptions therefor will be omitted.

Embodiment 1

FIG. 1 is a sectional view of a piezoelectric device 1. The piezoelectric device 1 comprises a piezoelectric element 4 including a piezoelectric body 2 and electrodes 3, metal plates 6 and fixing portions 10 as shown in FIG. 1. The material of the piezoelectric body 2 is, for example, a lead zirconate titanate (PZT)-based piezoelectric ceramics. The material of the piezoelectric member is not particularly limited to a specific material, but any material other than PZT may be used as long as it is a piezoelectric body. The piezoelectric body 2 has a rectangular plate-like shape and is polarized in a direction indicated with arrows in FIG. 1. However, the shape of the piezoelectric body 2 is not limited to a rectangular plate-like shape.

The material of the electrodes 3 is a conductor such as silver, palladium or copper. The electrodes 3 are thinly printed on both main surfaces of the piezoelectric body 2. The plate-like piezoelectric element 4 is constructed of the piezoelectric body 2 and the electrodes 3. The term "main surfaces" mean widest surfaces in the surfaces of the plate-like body, which are opposite to each other in the thickness direction thereof. As a method for thinly forming the electrodes on the both main surfaces of the piezoelectric body, in addition to the printing, thermal splaying, sputtering or the like may be used. Since the electrodes are thinly formed, the entire piezoelectric element receives little influence therefrom and the influence is negligible with respect to the elastic modulus or coefficient of thermal expansion. That is, the elastic modulus and the coefficient of thermal expansion of the piezoelectric element are substantially the same as those of the piezoelectric body.

The piezoelectric element 4 has a pair of metal plates 6 fixed to the both main surfaces thereof as conductive members. Owing to this, even when the piezoelectric element 4 is bent together with the metal plate 6 by an impact of external force or due to an external force, the piezoelectric element 4 is prevented from being extremely skewed, and thus the surface of the piezoelectric element 4 can be prevented from being cracked due to a stress. Also, even when the piezoelectric element 4 suffers a crack on the surfaces thereof and the electrodes 3 are divided, the piezoelectric element 4 preserves the area contributing to the generation of electricity and provides satisfactory electric power without degrading its properties. Since a piece of piezoelectric body 2 having a plate-like shape is sandwiched by two pieces of the metal plates 6, the piezoelectric element 4 can be prevented from warping. The material of the metal plates 6 is preferably a material for spring having a larger elastic modulus and coefficient of thermal expansion than those of the piezoelectric element 4 like SUS, phosphor bronze, titanium, stainless or copper. The metal plates 6 and the piezoelectric element 4 are bonded to one another in a heated state and cooled to a room temperature, and are put into use. Being cooled, the metal plates 6 contract and hold the piezoelectric element 4 while compressing the same in a direction parallel to the both main surfaces. Owing to this, the metal plates 6 fixed to the both main surfaces give a compression stress to the piezoelectric element 4. That is, the metal plates 6 compress the piezoelectric element 4 in the direction parallel to the both main surfaces. As a result, a tensile stress caused from vibration of the piezoelectric element 4 can be reduced. Moreover, the piezoelectric element 4 is made to easily follow the movement of the metal plates 6.

As for the material for the metal plate 6, in addition to the above materials, a material in which conductive ceramics is mixed with a conductive resin, or a conductive elastic material such as a resin including carbon fibers may be used. Both of the pair of metal plates 6 are preferably formed in the same shape using the same material. Owing to this, the piezoelectric device 1 has a symmetrical structure with respect to the piezoelectric element 4. Therefore, a uniform compression stress acts on the piezoelectric device 1, thus the piezoelectric device 1 can be further prevented from warping. Moreover, when the piezoelectric element 4 and the metal plates 6 are allowed to be in free vibration freely, the quality factor Q is further increased and the conversion efficiency of energy can be improved.

The piezoelectric element 4 and the metal plates 6 are fixed to one another using an adhesive such as a thermosetting resin. The plate-like body is formed by laminating the pair of metal plates 6 so as to sandwich the piezoelectric element 4 as shown in the sectional view of FIG. 1. When the piezoelectric device 1 is intended to be used at a room temperature, the metal plates 6 are fixed to the piezoelectric element 4 so that the piezoelectric element 4 receives a compression stress in a direction parallel to the main surfaces at a room temperature. Owing to this, the compression stress is given to the piezoelectric element 4 in advance, thereby reducing the tensile stress, which is generated within the piezoelectric element by an external force. As a result, the surfaces of the piezoelectric element 4 can be prevented from being cracked by the tensile stress generated within the piezoelectric element 4.

Ultimately, when the piezoelectric element 4 receives a compression stress in a direction parallel to the main surfaces while the piezoelectric device 1 is in use, an effect to reduce the tensile stress is obtained. Therefore, when the piezoelectric device 1 is intended to be used at a room temperature or lower, the piezoelectric element 4 and the metal plates 6 may be fixed to one another at a room temperature using an adhesive which hardens at a room temperature. Also, the adhesive may be a conductive adhesive.

The plate-like body is fixed by the fixing portions 10 at one end thereof, thus the piezoelectric device 1 has a structure of cantilever. The fixing portions 10 fix the plate-like body fixing at one end thereof by physically fastening the same from both main surfaces sides. An adhesive may be used for fixing the plate-like body.

Figure 2:
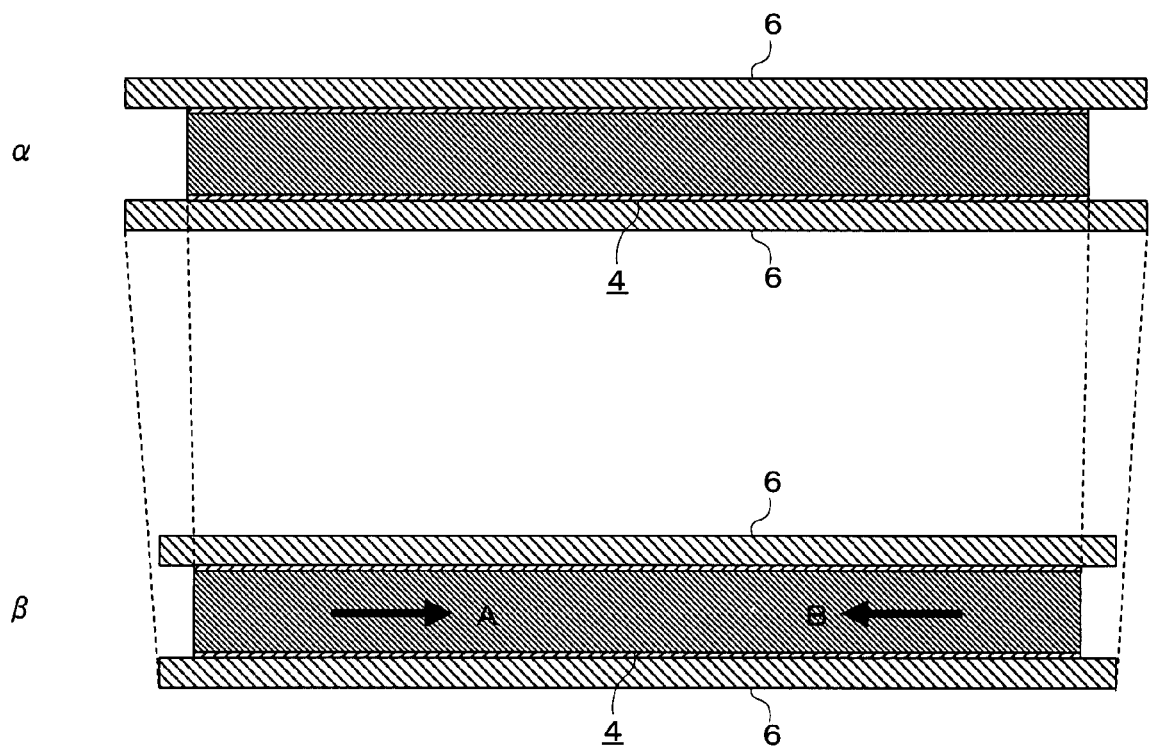
FIG. 2α is a sectional view showing a heated piezoelectric element and conductive member.

An example of manufacturing method of the piezoelectric device 1 will be hereinafter described. The lead zirconate titanate (PZT)-based piezoelectric body 2 is made using a common manufacturing method of piezoelectric ceramics. Electrodes are printed on the both main surfaces of the piezoelectric body 2 in a manner of screen printing, thus the piezoelectric element 4 having a plate-like shape is obtained. A pair of metal plates 6 is bonded onto the both main surfaces of the piezoelectric element 4 with an epoxy resin as shown in FIG. 2α. And then, the piezoelectric element 4 and the metal plates 6 are heated while thermocompression bond. After being heated to a temperature enough to harden the epoxy resin, the piezoelectric element 4 and the metal plates 6 are cooled to a room temperature. At this time, since the coefficient of thermal expansion of the metal plates 6 is larger than that of the piezoelectric element 4, the piezoelectric element 4 receives a compression stress in the directions indicated with arrows A and B in FIG. 2β due to the contraction of the cooled metal plates 6. Therefore, the piezoelectric element 4 is kept under a constant compression stress at a room temperature unless external force is given thereto. Then, the piezoelectric element 4 is subjected to a polarization processing. The polarization processing is carried out in oil heated to, for example, Curie temperature or higher. Finally, one end of the plate-like body constructed of the piezoelectric element 4 and the metal plates 6 is fixed by the fixing portions 10, thus the piezoelectric device 1 is manufactured.

Next, the operation of the piezoelectric device 1 will be described. When an external force is given to the piezoelectric device, the piezoelectric element is deformed and generates electricity as described below.

Figure 3:
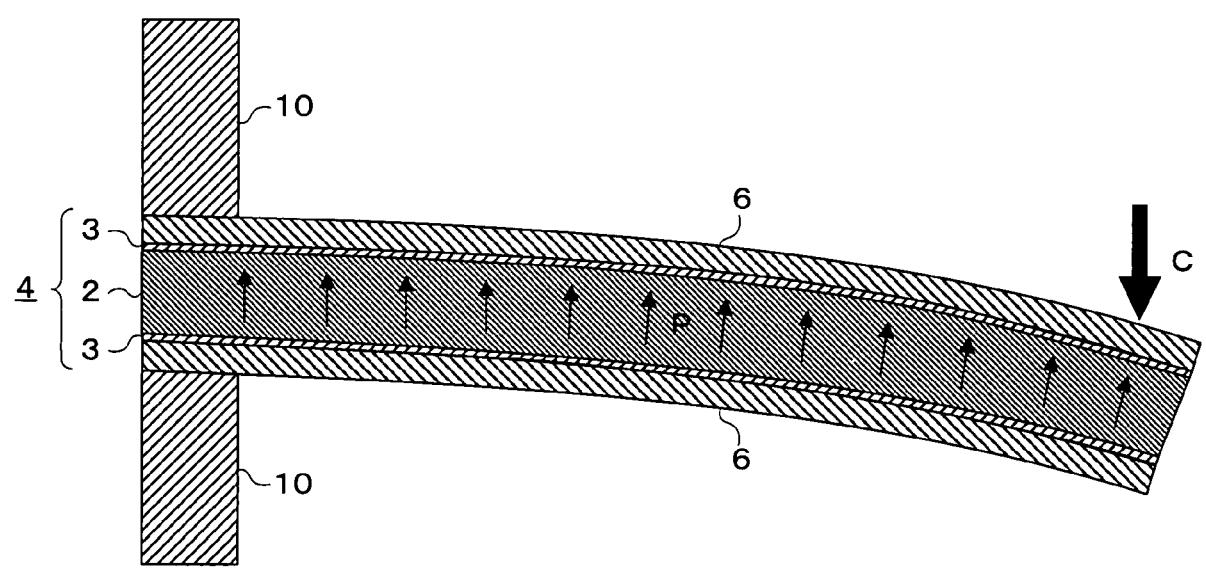
FIG. 3 is a sectional view showing the first embodiment of a piezoelectric device in accordance with the present invention.
Figure 4:
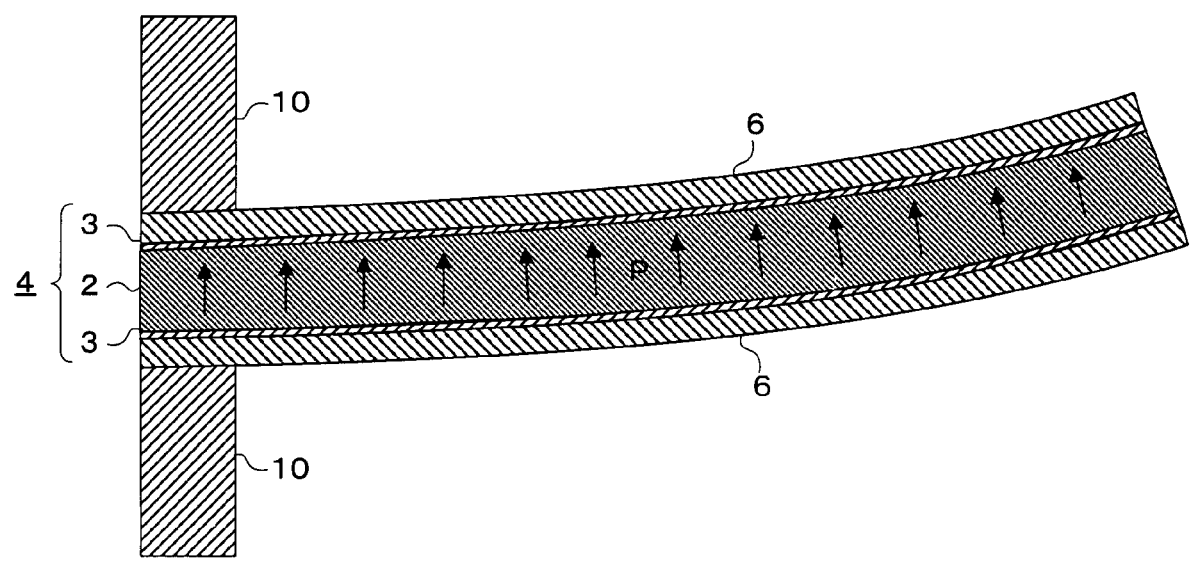
FIG. 4 is a sectional view showing the first embodiment of the piezoelectric device in accordance with the present invention.

First of all, an external force is given to a free end of the cantilever of the piezoelectric device 1 in a C-direction as shown in FIG. 3. Owing to this, the plate-like body having the piezoelectric element 4 and the metal plates 6 is bent. At this time, the piezoelectric body 2 is also bent together with the metal plates 6 and electrodes 3. When the cantilever is released from the external force, the cantilever swings toward the opposite side as shown in FIG. 4 and then vibrates freely. The piezoelectric body 2 is bent and vibrates following the bend of the metal plates 6. When the free end swings toward one side, a voltage is generated in a direction opposite to a polarization direction, and when the free end swings toward the other side, a voltage is generated in the same direction as the polarization direction.

When an external force is given in a C-direction as shown in FIG. 3, an upper side (outer peripheral side) of the piezoelectric device displaces toward an expanding direction with respect to the electrode at the lower side (curvature center side) of the piezoelectric device. Thereby, the electrical potential of the upper side electrode becomes lower than that of the lower side electrode. That is, an electric field is generated in a direction opposite to the polarization direction. In a state shown in FIG. 4, the upper side (curvature center side) of the piezoelectric device displaces in a contracting direction with respect to the electrode at the lower side (outer peripheral side) of the piezoelectric device. Thereby, the electrical potential of the upper side electrode becomes higher than that of the lower side electrode. That is, an electric field is generated in the same direction as the polarization direction.

Figure 5:
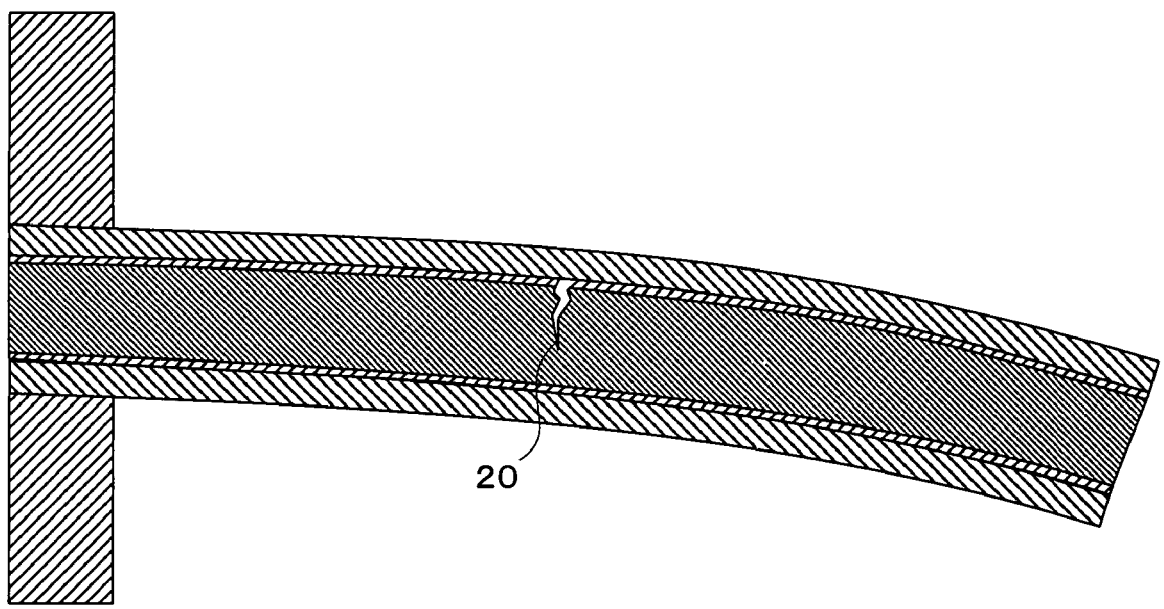
FIG. 5 is a sectional view showing the first embodiment of the piezoelectric device in accordance with the present invention.

In the piezoelectric device 1, the piezoelectric body 2 is protected by the metal plates 6. Therefore, compared to the conventional piezoelectric device for generating electricity, the crack is hardly generated. However, there may be such a case that a crack 20 is generated as shown in FIG. 5. In the conventional piezoelectric device for generating electricity, when a crack is generated, the conductivity between the electrode at an anterior of the crack and an extraction electrode is lost. Consequently, the generated electricity at the anterior of the crack is not contributed. Contrarily, in the piezoelectric device 1, the metal plate 6 maintains the contact with the electrode at the anterior of the crack 20. Therefore, even when a crack is generated, the piezoelectric device 1 performs without reducing the efficiency.

Embodiment 2

Figure 6:
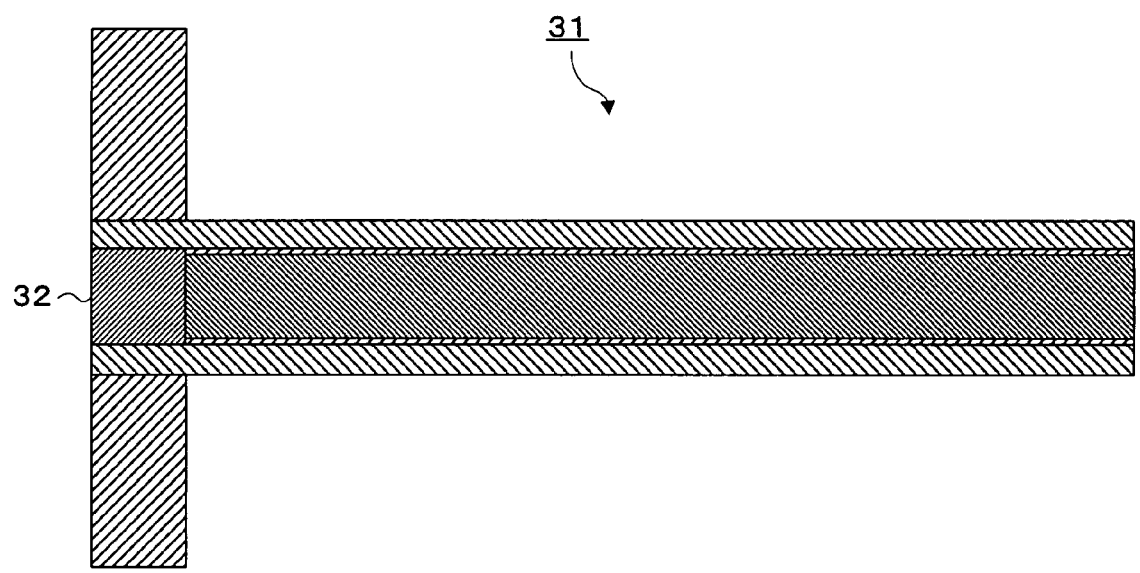
FIG. 6 is a sectional view showing a second embodiment of the piezoelectric device in accordance with the present invention.

In the above-described piezoelectric device 1, a fixed end of the cantilever has a structure such that the piezoelectric element 4 is sandwiched by the pair of metal plates 6. However, a piezoelectric device 31 may have such a structure that an insulator 32 is interposed between the metal plates 6 in place of the piezoelectric element 4 only in a portion of a fixed end as shown in FIG. 6. In the fixed end, even when the piezoelectric element 4 is fixed, since the piezoelectric element 4 does not deform, the piezoelectric element 4 does not contribute to the generation of electricity. Contrarily, the electric energy, which is generated by vibration of the free end, may be consumed at the fixed end. By arranging as described above, compared to the case where the piezoelectric element 4 is provided between the fixed ends of the pair of metal plates 6, the energy loss can be reduced. Moreover, in the fixing portions 10, metal plates 6 may be used as extraction electrodes as they are.

The fixed end portion only may have such a structure that the electrodes 3 are eliminated from the piezoelectric element 4. That is, the fixed end portion may have such a structure that the piezoelectric body 2 is directly sandwiched by the metal plates 6. In the portion where the electrodes 3 are not provided, the piezoelectric body 2 is not subjected to the polarization processing. Moreover, when the metal plates 6 are directly fixed to the piezoelectric body 2, since the connection therebetween is poor, the loss due to inverse piezoelectric effect does not occur. Therefore, compared to the case where the piezoelectric element 4 is provided between the pair of end portions of the metal plates 6, which do not contribute to the generation of electricity, the energy loss can be reduced.

In this case, in a printing process of the electrode 3, the fixed end areas are not printed with the electrodes. Owing to this, only by adjusting the area for the electrode to be printed, the piezoelectric device can be made easily, and thus the labor and cost can be reduced.

Embodiment 3

Figure 7:
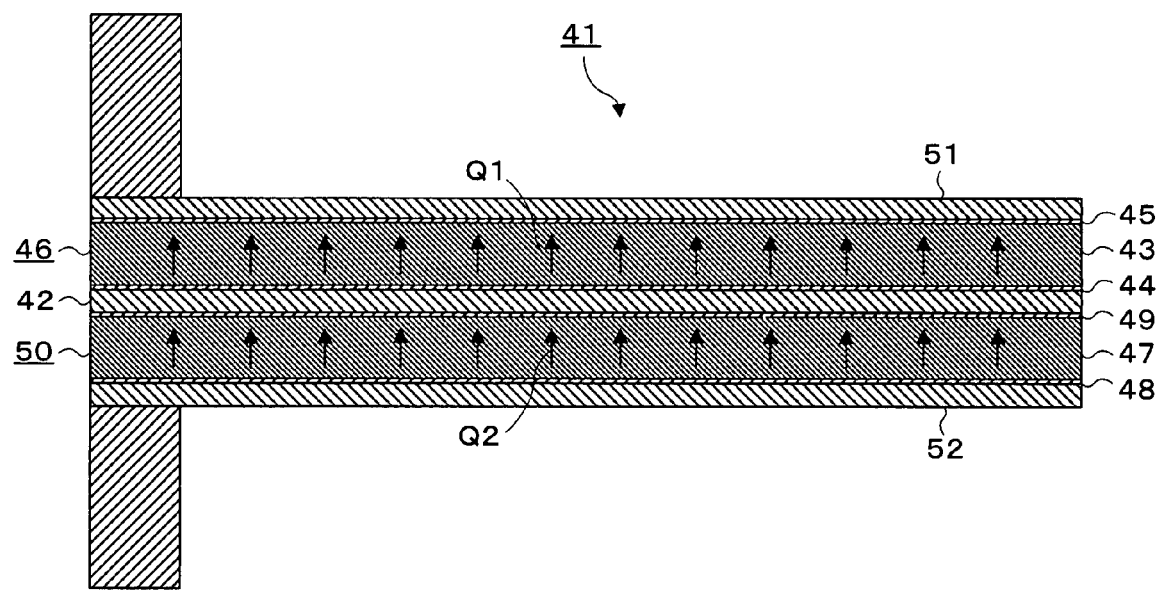
FIG. 7 is a sectional view showing a third embodiment of the piezoelectric device in accordance with the present invention.

The above-described piezoelectric device 1 has a single plate piezoelectric element 4. However, a structure may be adopted such that two pieces of the piezoelectric elements are sandwiched between three pieces of the metal plates as shown in FIG. 7. A piezoelectric device 41 comprises a metal plate 42 as a central conductive member, a piezoelectric element 46 as a first piezoelectric element, a piezoelectric element 50 as a second piezoelectric element, a metal plate 51 as a first conductive member and a metal plate 52 as a second elastic conductive member.

The metal plate 42 is formed in a rectangular plate-like shape. The piezoelectric element 46 is polarized in a Q1 direction as a first piezoelectric body and has a piezoelectric member 43 formed in a rectangular plate-like shape and a pair of electrodes 44 and 45 provided on both main surfaces. The piezoelectric element 46 is formed in a plate-like shape and fixed to one main surface of the metal plate 42. The piezoelectric element 50 has a piezoelectric body 47 polarized in a Q2 direction as a second piezoelectric body and a pair of electrodes 48 and 49 provided to both main surfaces thereof. The piezoelectric element 50 is formed in a plate-like shape and fixed to a main surface at a side opposite to the piezoelectric element 46 of the metal plate 42. The metal plate 51 is fixed to a main surface of the piezoelectric element 46 at the opposite side of the metal plate 42. The metal plate 52 is fixed to a main surface of the piezoelectric element 50 at the opposite side of the metal plate 42.

As described above, the piezoelectric device 41 is provided with the metal plates 51 and 52 respectively at the outer side of the piezoelectric element 46 and piezoelectric element 50. Owing to this arrangement, since the piezoelectric elements 46 and 50 are not extremely deformed due to an impact of external force or by an external force, the surfaces of the piezoelectric elements 46 and 50 are prevented from being cracked due to a stress. Even when the surface of the piezoelectric elements 46 and 50 is cracked and the electrode on the surface of the element is divided, the area of the element contributing to the generation of electricity is preserved. Therefore, satisfactory electric power can be obtained without degrading its properties. Moreover, since piezoelectric elements 46 and 50 having a plate-like shape are sandwiched between the metal plates 42, 51 and 52 respectively, the piezoelectric elements 46 and 50 are prevented from warping. Further, since two pieces of the piezoelectric elements are used, even when the piezoelectric elements are thin, a large voltage can be obtained.

As the material of the metal plates 42, 51 and 52, for example, the same material as that of the metal plate 6 in the embodiment 1 may be used. However, the material of the metal plates 42, 51 and 52 is not particularly limited to the above. As the material of the piezoelectric elements 46 and 50, for example, the same material as that of the piezoelectric element 4 of the embodiment 1 may be used. The material of the piezoelectric elements 46 and 50 is not particularly limited to the above.

The manufacturing method of the piezoelectric device 41 is the same as that of the piezoelectric device 1. However, in the process to bond the metal plates to the piezoelectric elements with an epoxy resin, the two pieces of piezoelectric elements are sandwiched between the three pieces of metal plates and heated while being held in close contact with one another. Further, the polarization processing is carried out so that the polarization direction Q1 of the piezoelectric body 43 and the polarization direction Q2 of the piezoelectric body 47 are the same.

The operation of the piezoelectric device 41 is the same as the operation of the piezoelectric device 1. The piezoelectric elements 46 and 50 given with an external force are bent and vibrate freely. When the free end swings toward a direction of the given external force, a voltage is generated in the direction opposite to the polarization direction. When the free end swings toward a direction opposite to the given external force, a voltage is generated in the same direction as the polarization direction. For example, when an external force is given in a direction opposite to the Q1 direction and the free end swings in a direction opposite to the Q1 direction, the piezoelectric elements 46 and 50 as a whole contract and generate a voltage in a direction opposite to the polarization direction. When the free end swings in the same direction as the Q1 direction, the piezoelectric elements 46 and 50 as a whole expand and both of the piezoelectric elements 46 and 50 generate a voltage in the same direction as the polarization direction Q1, Q2.

Embodiment 4

Figure 8:
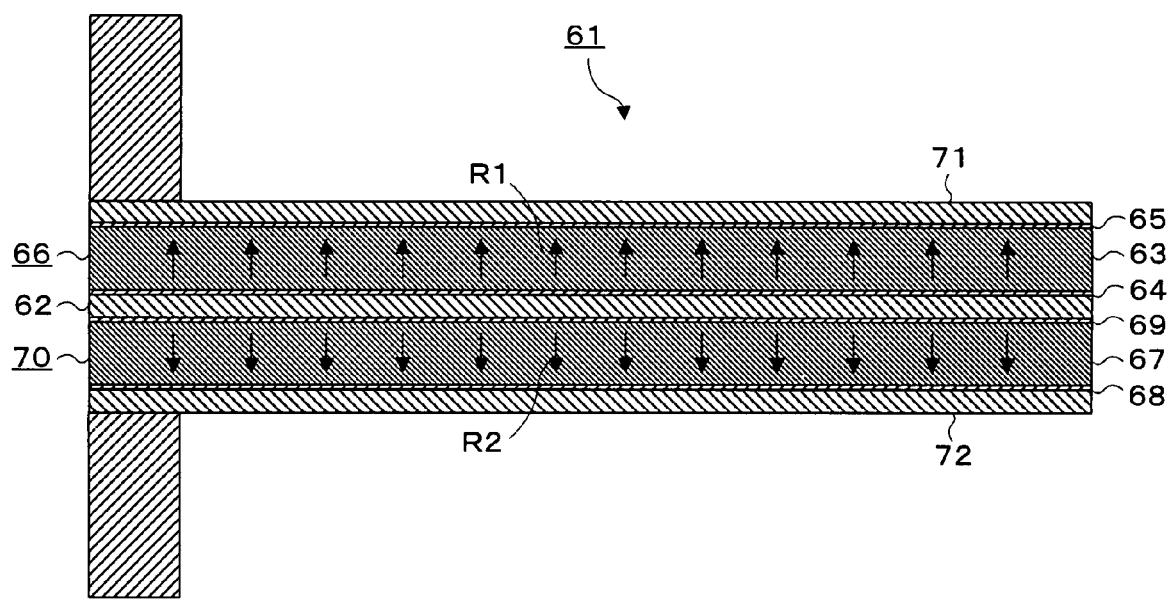
FIG. 8 is a sectional view showing a fourth embodiment of the piezoelectric device in accordance with the present invention.

In the above-described piezoelectric device 41, the polarization direction Q1 of the piezoelectric body 43 is the same as the polarization direction Q2 of the piezoelectric body 47. However, a polarization direction R1 of a piezoelectric body 63 may be opposite to a polarization direction R2 of a piezoelectric body 67 as shown in FIG. 8. The piezoelectric device 61 has substantially the same structure as that of the piezoelectric device 41. The metal plate 62, a piezoelectric element 66, a piezoelectric body 63, electrodes 64 and 65, a piezoelectric element 70, a piezoelectric body 67, electrodes 68 and 69, a metal plate 71 and a metal plate 72 of the piezoelectric device 61 are equivalent respectively to the metal plate 42, the piezoelectric element 46, the piezoelectric body 43, the electrodes 44 and 45, the piezoelectric element 50, the piezoelectric body 47, the electrodes 48 and 49, the metal plate 51 and the metal plate 52 of the piezoelectric device 41. It should be noted that the polarization direction R1 of the piezoelectric body 63 and the polarization direction R2 of the piezoelectric body 67 are polarized so as to be opposite to each other.

The operation of the piezoelectric device 61 will be described. The piezoelectric elements 66 and 70 given with an external force are bent and vibrate freely. For example, when the free end swings toward the R2 direction, the piezoelectric body 63 expands in a longitudinal direction (a direction from the fixed end to the free end), and the piezoelectric body 67 contracts in the longitudinal direction with respect to the central metal plate 62. Thus, a voltage is generated in the same direction as that of the R1 between the electrode 65 and the electrode 64, and a voltage is generated in a direction opposite to the R2 direction between the electrode 69 and the electrode 68. When the free end swings toward the same direction as that of R1, the piezoelectric body 63 contracts in the longitudinal direction and the piezoelectric body 67 expands in the longitudinal direction with respect to the central metal plate 62. Thus, a voltage is generated in a direction opposite to that of R1 between the electrode 65 and the electrode 64, and a voltage is generated in the same direction as that of R2 between the electrode 69 and the electrode 68. Although the piezoelectric device 61 operates in a different manner from that of the piezoelectric device 41, but the piezoelectric device 61 provides the same effect as that of the piezoelectric device 41.

Embodiment 5

Figure 9:
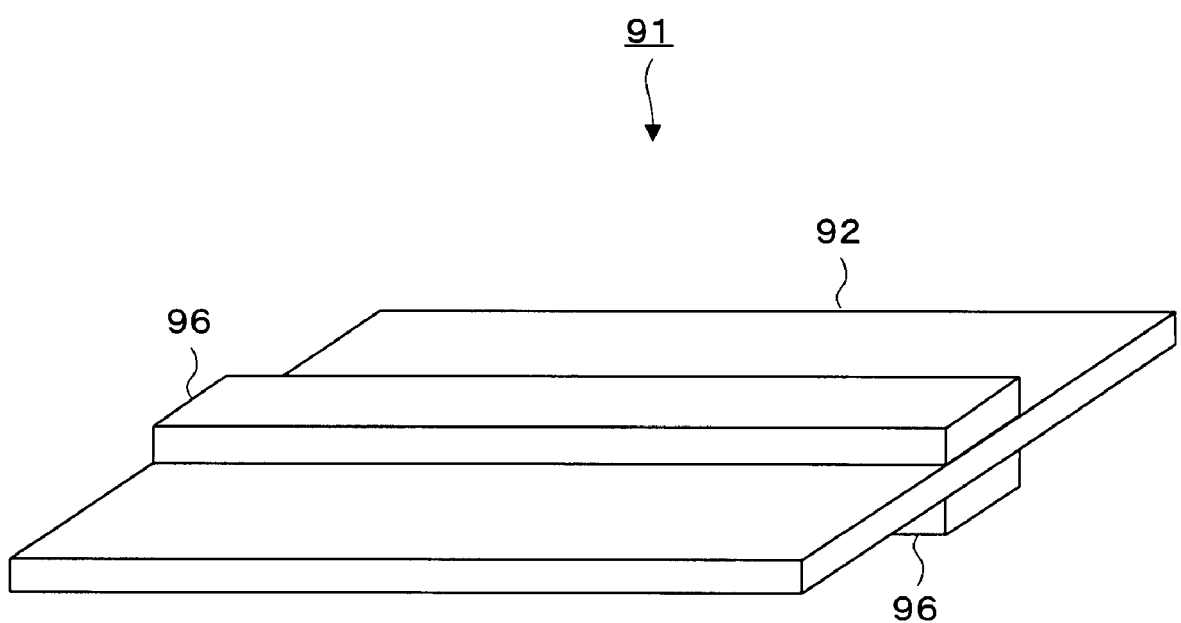
FIG. 9 is a perspective view showing a fifth embodiment of the piezoelectric device in accordance with the present invention.

In the above-described piezoelectric device 1, the pair of metal plates 6 is fixed entirely to the both main surfaces of the piezoelectric element 4. However, the pair of metal plates may be fixed to only a part of the both main surfaces. FIG. 9 is a perspective view of a piezoelectric device 91, in which a pair of metal plates is fixed to only a part of the both main surfaces of the piezoelectric element 4. The piezoelectric device 91 comprises a piezoelectric body 92 and a pair of metal plates 96 and electrodes (not shown). The electrodes (not shown) are provided respectively between the piezoelectric body 92 and the pair of metal plates 96 and fixed to the piezoelectric body 92 and the pair of metal plates 96.

The pair of metal plates 96 are fixed to only a part of the both main surfaces of the piezoelectric body 92 having a plate-like shape as shown in FIG. 9. The pair of metal plates 96 is preferably formed symmetrically with respect to the piezoelectric body 92. Owing to this arrangement, the piezoelectric device 91 has a symmetrical structure with respect to the piezoelectric body 92. Therefore, the compression stress acts uniformly, and thus the warp can be further prevented. Also, when the piezoelectric device 91 is allowed to be in free vibration, quality factor Q becomes larger and conversion efficiency of the energy can be improved.

Figure 10:
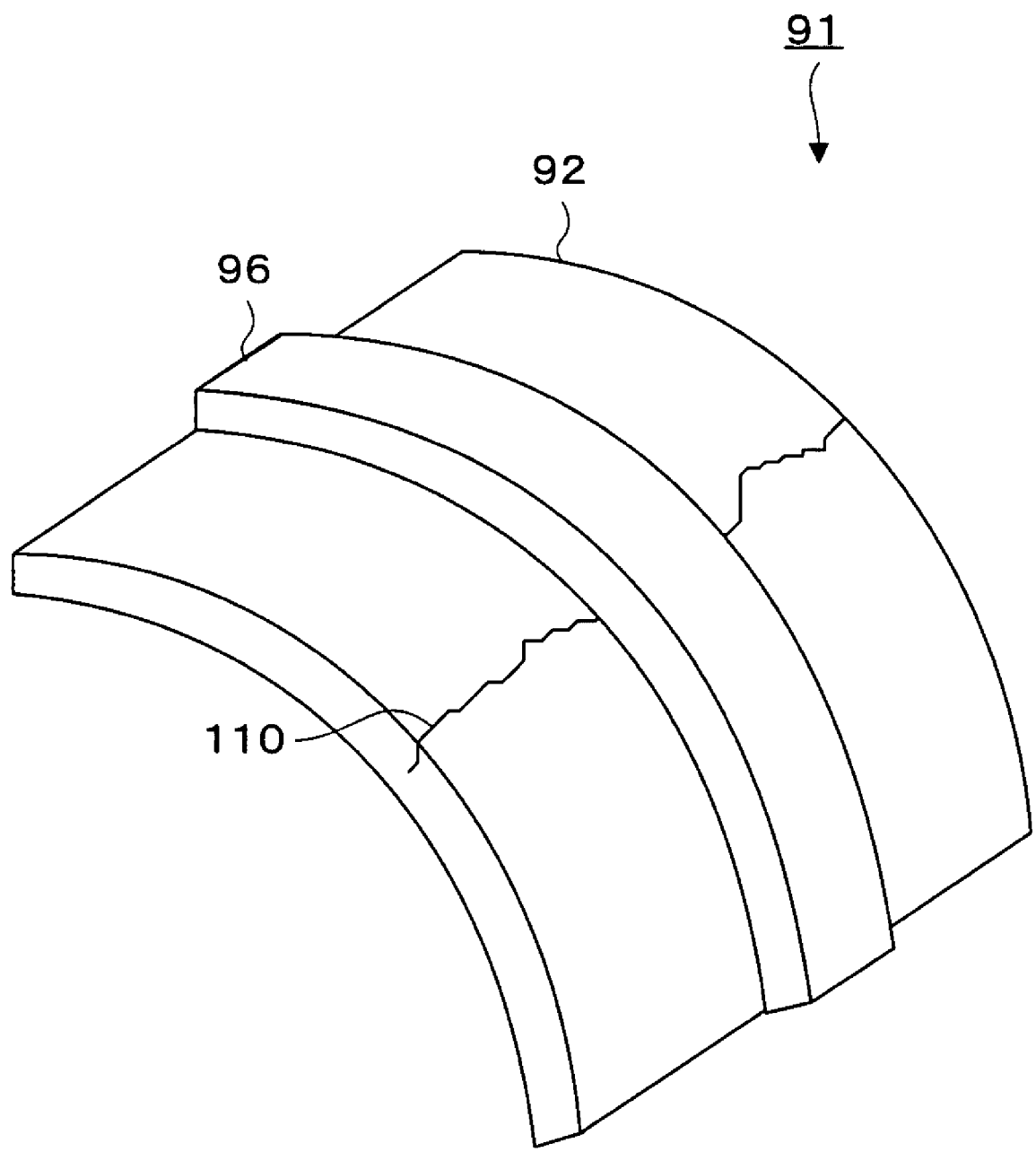
FIG. 10 is a perspective view showing the fifth embodiment of the piezoelectric device in accordance with the present invention.

The part of the both main surfaces, to which the pair of metal plates 96 is fixed, preferably extends in a longitudinal direction (a direction from the fixed end to the free end) of the piezoelectric device 91. For example, when the piezoelectric device 91 is bent and a crack occurs, ordinarily a crack 110 occurs in a direction orthogonal to the longitudinal direction as shown in FIG. 10. When the pair of metal plates 96 is fixed to a part of the both main surfaces of the piezoelectric body 92 in a longitudinal direction (a direction from the fixed end to the free end) of the piezoelectric device 91, even when such crack 110 occurs, the conductivity can be maintained. Also, in this case, by reducing the materials of the pair of metal plates 96, such an effect can be obtained that the cost for the material can be reduced.

Embodiment 6

There will be hereinafter described an embodiment in which a piezoelectric device 1, 31, 41, 61 or 91 described in embodiments 1 to 5 is utilized in a piezoelectric switch.

Figure 11:
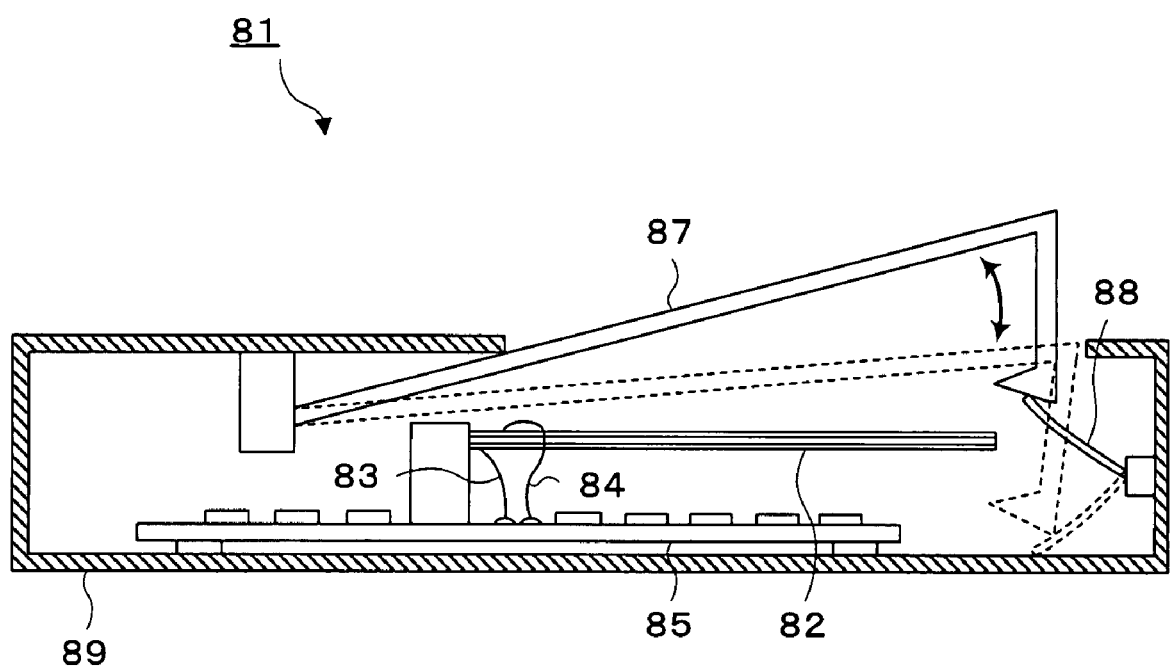
FIG. 11 is a sectional view showing a piezoelectric switch in accordance with the present invention.

A piezoelectric switch 81 comprises a piezoelectric device 82, lead wires 83 and 84 and a signal generating circuit 85 as shown in FIG. 11. The piezoelectric switch 81 further comprises a switch 87 for driving the piezoelectric device 82, a switch returning spring 88 and a case 89. The piezoelectric device 1, 31, 41, 61 or 91 is utilized as the piezoelectric device 82. The piezoelectric switch 81 is arranged so that the cantilever of the piezoelectric device 82 can be bent by applying a force to the free end of the piezoelectric device 82 using the switch 87.

The switch 87 is constructed of a member having a substantially L-like shape in section and a holding member for holding one end thereof in a swingable manner. In a ordinary state (a state that the switch 87 is not operated), the one end of the switch 87 is in contact with the switch returning spring 88 and is energized thereby so that a bent portion (a bent and angled portion) of the switch 87 protrudes out of the case 89 as shown in FIG. 11. When the bent portion of the switch 87 is given an external force by a person to press the same into the case 89, the switch returning spring 88 receives the external force from the switch 87 and is bent. When the switch 87 is released from the pressing force, the switch 87 is allowed to return to the previous ordinary state. As described above, the switch 87 and the switch returning spring 88 integrally constitutes a push-on/off type manual switch. The switch 87 has a projection that comes into contact with the free end of the piezoelectric device 82 and bends the piezoelectric device 82. The signal generating circuit 85 is a circuit that converts a voltage, which is generated by the piezoelectric device 82 and taken out from the pair of conductive members through the lead wires 83 and 84, into an electric signal.

By arranging as described above, even when the piezoelectric device 82 is bent due to an impact of an external force or by an external force, the piezoelectric device 82 is not extremely deformed. Therefore, the surface of the piezoelectric element is prevented from being cracked or causing a breakage of the piezoelectric switch 81. Even when the surface of the piezoelectric element gets a crack and the electrode is divided, the area of the element contributing to the generation of electricity can be preserved, and thus a satisfactory electric signal can be obtained as the switch. Moreover, the piezoelectric device 82 has a structure such that a piece of piezoelectric member having a plate-like shape is sandwiched by the two pieces of the conductive members. Therefore, the piezoelectric element is prevented from warping, and thus the piezoelectric switch 81, which is easy to manufacture and hardly broken, can be achieved.

Next, the operation of the piezoelectric switch 81 will be described below. Ordinary, the switch 87 is in a state pushed up by the switch returning spring 88. At this time, the projection is positioned above the free end of the piezoelectric device 82.

When the bent portion of the switch 87 is pressed down into the case 89, the projection of the switch 87 comes into contact with the free end of the piezoelectric device 82 and bends the piezoelectric device 82 downward. The switch 87 can be pressed down until the switch returning spring 88 is brought into contact with a bottom plate of the case 89. While the switch 87 is pressed down to the bottom end, the free end of the piezoelectric device 82 is released from the projection of the switch 87. Thereby, the piezoelectric device 82 begins to vibrate freely, and then the free vibration decreases to stop.

After the switch 87 has pressed down to the bottom end, when the force pressing the switch 87 is removed, the switch 87 is pressed up by the switch returning spring 88 to return to the previous ordinary state. At this time, the projection of the switch 87 comes into contact with the piezoelectric device 82 again and bends the piezoelectric device 82 upward. And then, the free end of the piezoelectric device 82 is released from the projection. Thereby, the piezoelectric device 82 begins to vibrate freely again, and then the free vibration of the piezoelectric device 82 decreases to return to the previous ordinary state.

As described above, when the piezoelectric device 82 is bent and allowed to vibrate freely, the piezoelectric body generates a voltage owing to the piezoelectric effect (mainly, lateral effect (d31 mode)). When the switch 87 is pressed once and allowed to return to the previous ordinary state, the piezoelectric device 82 performs free vibration twice. Therefore, the piezoelectric device 82 outputs two alternating waveforms including a time-interval therebetween. The period of the time-interval between the alternating waveforms varies depending on the period of time the switch 87 is held in the pressed state.

The invention claimed is:

1. A piezoelectric device, comprising:
   a piezoelectric element having a plate-like shape including a piezoelectric body having a plate-like shape and polarized in a thickness direction thereof and a pair of electrodes formed on both main surfaces of said piezoelectric body; and
   a pair of elastic conductive members fixed to the both main surfaces of said piezoelectric element, the pair of elastic conductive members extending from one end to an opposite end in a longitudinal direction of the piezoelectric element,
   wherein, when an external force is applied, said piezoelectric body is deformed to generate electricity.

2. A piezoelectric device, comprising:
   a piezoelectric element having a plate-like shape including a piezoelectric body having a plate-like shape and polarized in a thickness direction thereof and a pair of electrodes formed on both main surfaces of said piezoelectric body; and
   a pair of elastic conductive members fixed to the both main surfaces of said piezoelectric element, the pair of elastic conductive members extending from one end to an opposite end in a longitudinal direction of the piezoelectric element,
   wherein, said piezoelectric element is held by said pair of elastic conductive members fixed to both main surfaces thereof being compressed in a direction parallel to the both main surfaces, and
   when an external force is applied, said piezoelectric body is deformed to generate electricity.

3. A piezoelectric device, comprising:
   a piezoelectric element having a plate-like shape including a piezoelectric body having a plate-like shape and polarized in a thickness direction thereof and a pair of electrodes formed on both main surfaces of said piezoelectric body; and
   a pair of elastic conductive members fixed to the both main surfaces of said piezoelectric element, the pair of elastic conductive members extending from one end to an opposite end in a longitudinal direction of the piezoelectric element,
   wherein, the coefficient of thermal expansion of said pair of elastic conductive members is larger than that of said piezoelectric element, and
   when an external force is applied, said piezoelectric body is deformed to generate electricity.

4. A piezoelectric device, comprising:
   a piezoelectric element having a plate-like shape including a piezoelectric body having a plate-like shape and polarized in a thickness direction thereof and a pair of electrodes formed on both main surfaces of said piezoelectric body; and
   a pair of elastic conductive members fixed to the both main surfaces of said piezoelectric element,
   wherein, said piezoelectric element has a rectangular plate-like shape,
   said pair of elastic conductive members has a rectangular plate-like shape, longer in one longitudinal direction than said piezoelectric element and protrude in one longitudinal direction from said piezoelectric element,
   a fixing portion for supporting and fixing a pair of end portions of said elastic conductive members, protruding in one longitudinal direction from said piezoelectric element is further comprised,
   said fixing portion is provided with an insulator between a pair of end portions of said elastic conductive members, protruding in one longitudinal direction from said piezoelectric element, and
   when an external force is applied, said piezoelectric body is deformed to generate electricity.

5. A piezoelectric device, comprising:
   a piezoelectric element having a plate-like shape including a piezoelectric body having a plate-like shape and polarized in a thickness direction thereof and a pair of electrodes formed on both main surfaces of said piezoelectric body; and
   a pair of elastic conductive members fixed to the both main surfaces of said piezoelectric element,
   wherein, said piezoelectric element has a rectangular plate-like shape, in which said piezoelectric body is longer in one longitudinal direction than said pair of electrodes, and
   a fixing portion for supporting and fixing a pair of end portions of said elastic conductive members, fixed to said piezoelectric body is comprised,
   said piezoelectric body and said pair of elastic conductive members are longer in a longitudinal direction thereof to the fixing portion side than said pair of electrodes,
   a portion of the piezoelectric body sandwiched by the pair of electrodes is polarized in a thickness direction thereof,
   a portion of the piezoelectric body protruding from said pair of the electrodes is not polarized, and
   when an external force is applied, said piezoelectric body is deformed to generate electricity.

6. A piezoelectric device, comprising:
   an elastic central conductive member formed in a plate-like shape;
   a first piezoelectric element formed in a plate-like shape including a first piezoelectric body, which is formed in a plate-like shape, fixed to one main surface of said central conductive member and polarized in a thickness direction thereof, and a pair of electrodes provided to the both main surfaces of said first piezoelectric body, the first piezoelectric element extending from one end to an opposite end in a longitudinal direction of the elastic central conductive member;

a second piezoelectric element formed in a plate-like shape including a second piezoelectric body, which is formed in a plate-like shape, fixed to the other main surface of said central conductive member and polarized in a thickness direction thereof, and a pair of electrodes provided to the both main surfaces of said second piezoelectric body, the second piezoelectric element extending from the one end to the opposite end of the elastic central conductive member;

a first elastic conductive member fixed to a main surface at a side opposite to said central conductive member side of said first piezoelectric element, the first elastic conductive member extending from one end to an opposite end in a longitudinal direction of the first piezoelectric element; and a second elastic conductive member fixed to a main surface at a side opposite to said central conductive member side of said second piezoelectric element, the second elastic conductive member extending from one end to an opposite end in a longitudinal direction of the second piezoelectric element, wherein when an external force is applied thereto, said first piezoelectric body and said second piezoelectric body are deformed to generate electricity.

7. The piezoelectric device according to claim 2, wherein an elastic modulus of said pair of elastic conductive members is larger than that of said piezoelectric element.

8. The piezoelectric device according to claim 2, wherein material and shape of an elastic conductive member fixed to one electrode of said piezoelectric element are the same as those of an elastic conductive member fixed to the other electrode.

9. A piezoelectric switch, comprising:
a piezoelectric device set forth in claim 2;
an external force transmitting section for transmitting an external force to bend said piezoelectric element and said elastic conductive member of said piezoelectric device; and
a signal generating circuit that takes out a voltage generated by said piezoelectric element vibrated by the transmitted external force from said pair of elastic conductive members and converts the voltage into an electric signal.

10. The piezoelectric device according to claim 3, wherein an elastic modulus of said pair of elastic conductive members is larger than that of said piezoelectric element.

11. The piezoelectric device according to claim 4, wherein an elastic modulus of said pair of elastic conductive members is larger than that of said piezoelectric element.

12. The piezoelectric device according to claim 5, wherein an elastic modulus of said pair of elastic conductive members is larger than that of said piezoelectric element.

13. The piezoelectric device according to claim 6, wherein an elastic modulus of said pair of elastic conductive members is larger than that of said piezoelectric element.

14. The piezoelectric device according to claim 3, wherein material and shape of an elastic conductive member fixed to one electrode of said piezoelectric element are the same as those of an elastic conductive member fixed to the other electrode.

15. The piezoelectric device according to claim 4, wherein material and shape of an elastic conductive member fixed to one electrode of said piezoelectric element are the same as those of an elastic conductive member fixed to the other electrode.

16. The piezoelectric device according to claim 5, wherein material and shape of an elastic conductive member fixed to one electrode of said piezoelectric element are the same as those of an elastic conductive member fixed to the other electrode.

17. The piezoelectric device according to claim 6, wherein material and shape of an elastic conductive member fixed to one electrode of said piezoelectric element are the same as those of an elastic conductive member fixed to the other electrode.

18. The piezoelectric device according to claim 7, wherein material and shape of an elastic conductive member fixed to one electrode of said piezoelectric element are the same as those of an elastic conductive member fixed to the other electrode.

19. A piezoelectric switch, comprising:
a piezoelectric device set forth in claim 3;
an external force transmitting section for transmitting an external force to bend said piezoelectric element and said elastic conductive member of said piezoelectric device; and
a signal generating circuit that takes out a voltage generated by said piezoelectric element vibrated by the transmitted external force from said pair of elastic conductive members and converts the voltage into an electric signal.

20. A piezoelectric switch, comprising:
a piezoelectric device set forth in claim 4;
an external force transmitting section for transmitting an external force to bend said piezoelectric element and said elastic conductive member of said piezoelectric device; and
a signal generating circuit that takes out a voltage generated by said piezoelectric element vibrated by the transmitted external force from said pair of elastic conductive members and converts the voltage into an electric signal.

* * * * *